(12) United States Patent
Cheng et al.

(10) Patent No.: US 12,396,199 B2
(45) Date of Patent: Aug. 19, 2025

(54) HIGH-LINEARITY GAN HEMT RADIO FREQUENCY POWER DEVICE FOR IMPROVING TRANSCONDUCTANCE UNDER LARGE SIGNAL

(71) Applicants: HDU Fuyang Electronic Information Research Institute Co., Ltd., Zhejiang (CN); HangZhou DianZi University, Hangzhou (CN)

(72) Inventors: Zhiqun Cheng, Zhejiang (CN); Chao Le, Zhejiang (CN)

(73) Assignees: HangZhou DianZi University, Hangzhou (CN); HDU Fuyang Electronic Information Research Institute Co., Ltd., Hangzhou (CN)

( * ) Notice: Subject to any disclaimer, the term of this patent is extended or adjusted under 35 U.S.C. 154(b) by 473 days.

(21) Appl. No.: 17/959,048

(22) Filed: Oct. 3, 2022

(65) Prior Publication Data
US 2023/0246099 A1    Aug. 3, 2023

(30) Foreign Application Priority Data
Jan. 28, 2022   (CN) .......................... 202210105445.0

(51) Int. Cl.
| | |
|---|---|
| H10D 30/47 | (2025.01) |
| H01L 23/66 | (2006.01) |
| H10D 62/824 | (2025.01) |
| H10D 62/85 | (2025.01) |

(52) U.S. Cl.
CPC .......... *H10D 30/475* (2025.01); *H01L 23/66* (2013.01); *H10D 30/4755* (2025.01); *H10D 62/824* (2025.01); *H10D 62/8503* (2025.01)

(58) Field of Classification Search
CPC .................... H10D 30/4735; H10D 30/474
See application file for complete search history.

(56) References Cited

U.S. PATENT DOCUMENTS

| | | | |
|---|---|---|---|
| 2012/0211801 A1* | 8/2012 | Hashimoto | H10D 30/4738 257/E29.091 |
| 2021/0296311 A1* | 9/2021 | Iwao | H10D 84/05 |
| 2022/0029007 A1* | 1/2022 | Chen | H10D 62/824 |

\* cited by examiner

*Primary Examiner* — Grant S Withers
(74) *Attorney, Agent, or Firm* — Kirk A. Wilson; Joseph T. Guy; Patent Filing Specialist Inc.

(57) ABSTRACT

It is provided a high-linearity GaN HEMT radio frequency power device for improving a transconductance under a large signal, including a substrate layer, a buffer layer, a second barrier layer, a channel layer, a first barrier layer, and a protection layer arranged in sequence. A source, a gate, and a drain are arranged on the protection layer. A first two-dimensional electron gas and a second two-dimensional electron gas are respectively formed between the channel layer and the first barrier layer and between the channel layer and the second barrier layer. The source, the gate, and the drain are configured to receive an external control signal to control motion of electrons in the first two-dimensional electron gas and the second two-dimensional electron gas formed by the channel layer. In case of the large signal, electrons in the second two-dimensional electron gas flow into the first two-dimensional electron gas.

12 Claims, 1 Drawing Sheet

HIGH-LINEARITY GAN HEMT RADIO FREQUENCY POWER DEVICE FOR IMPROVING TRANSCONDUCTANCE UNDER LARGE SIGNAL

CROSS REFERENCE TO RELATED APPLICATION

This patent application claims the benefit and priority of Chinese Patent Application No. 202210105445.0, entitled High-linearity GaN HEMT Radio Frequency Power Device for Improving Transconductance under Large Signal filed on Jan. 28, 2022, the disclosure of which is incorporated by reference herein in its entirety as part of the present application.

TECHNICAL FIELD

The present disclosure relates to the field of radio frequency power devices, and in particular, to a high-linearity gallium nitride (GaN) high electron mobility transistor (HEMT) radio frequency power device for improving a transconductance under a large signal.

BACKGROUND ART

With continuous development of wireless communication technology, communication system is constantly tending to display such characteristics as multi-carrier, wide dynamic range, and high peak-to-average ratio, which puts forward higher requirements for the linearity of the circuit radio frequency power amplifier, as the key component in the communication system. Generally speaking, the linearity of the radio frequency power amplifier is mainly determined by the linearity of a radio frequency power device.

GaN HEMT radio frequency power devices are widely used in various communication systems with high linearity performance due to their high breakdown voltage, high saturation speed and outstanding thermal properties. FIG. 1 shows a schematic cross-sectional diagram of the GaN HEMT radio frequency power device, where Drain is a drain port, Gate is a gate port, Source is a source port, $Si_3N_4$ is a dielectric material between every two of a gate, a drain, and a source, GaN cap is a device protection layer, AlGaN barrier layer is a barrier layer that confines free electrons in a two-dimensional electron gas to move, GaN channel is a channel layer having a high concentration of the free electrons, GaN buffer is a buffer layer, and Substrate is a substrate of the device. The basic working principle of the GaN HEMT radio frequency power device is as follows: when Drain, Gate, and Source receive an appropriate voltage, the free electrons are transmitted from the Source port to the Drain port through the two-dimensional electron gas, and a signal is inputted from the Gate port and outputted from the Drain port, thereby implementing signal amplification. A distortion during signal amplification is regarded as the linearity performance of the device. However, there remains a huge defect in linearity performance of existing GaN HEMT radio frequency power device, which directly limits further application of the GaN HEMT radio frequency power device in some communication systems that require high linearity performance.

Therefore, in view of the technical defects in the prior art, it is desired to provide a solution to overcome the technical problems existing in the prior art.

SUMMARY

To overcome the technical defects existing in the prior art, the present disclosure provides a high-linearity GaN HEMT radio frequency power device for improving a transconductance under a large signal. A second barrier layer is introduced onto a channel layer, and a second two-dimensional electron gas is formed between the second barrier layer and the channel layer. In case of the large signal, electrons in the second two-dimensional electron gas flow into a first two-dimensional electron gas, thereby ensuring a stable electron concentration in the first two-dimensional electron gas, relieving the decrease of gm, further relieving the tendency of a Δ value to be far from 0, and effectively improving the linearity of the device.

To solve the technical problems existing in the prior art, the technical solution of the present disclosure is as follows:

The high-linearity GaN HEMT radio frequency power device for improving a transconductance under a large signal includes a substrate layer, a buffer layer, a second barrier layer, a channel layer, a first barrier layer, and a protection layer arranged in sequence. A source, a gate, and a drain are arranged on the protection layer. A first two-dimensional electron gas and a second two-dimensional electron gas are respectively formed between the channel layer and the first barrier layer and between the channel layer and the second barrier layer. The source, the gate, and the drain are configured to receive an external control signal to control motion of electrons in the first two-dimensional electron gas and the second two-dimensional electron gas formed by the channel layer. When at the large signal, the electrons in the second two-dimensional electron gas flow into the first two-dimensional electron gas.

Optionally, the channel layer has a thickness of 100 nanometers.

Optionally, the channel layer is made of a GaN material.

Optionally, the first barrier layer and the second barrier layer are made of an AlGaN material.

Optionally, the substrate layer is made of a SiC material.

Optionally, the buffer layer is made of a GaN material.

Optionally, an $Si_3N_4$ dielectric material is filled between every two of the source, the gate, and the drain.

Compared with the prior art, according to the technical solution of the present disclosure, the second barrier layer is introduced onto the channel layer, such that a new layer of second two-dimensional electron gas is formed below the original first two-dimensional electron gas inside the device. When Pout is a small signal, the electron concentration in the first two-dimensional electron gas basically does not change. When Pout gradually increases, the electrons in the first two-dimensional electron gas are suctioned into the gate, the electrons in the newly formed second two-dimensional electron gas flow into the original two-dimensional electron gas at this time, so that the electron concentration in the first two-dimensional electron gas is greatly increased, to make up for the loss of the electrons in the first two-dimensional electron gas being suctioned into the gate at the large signal, thereby relieving the decrease of gm, further relieving the tendency of a Δ value to be far from 0, and effectively improving the linearity of the device.

Figure 1:
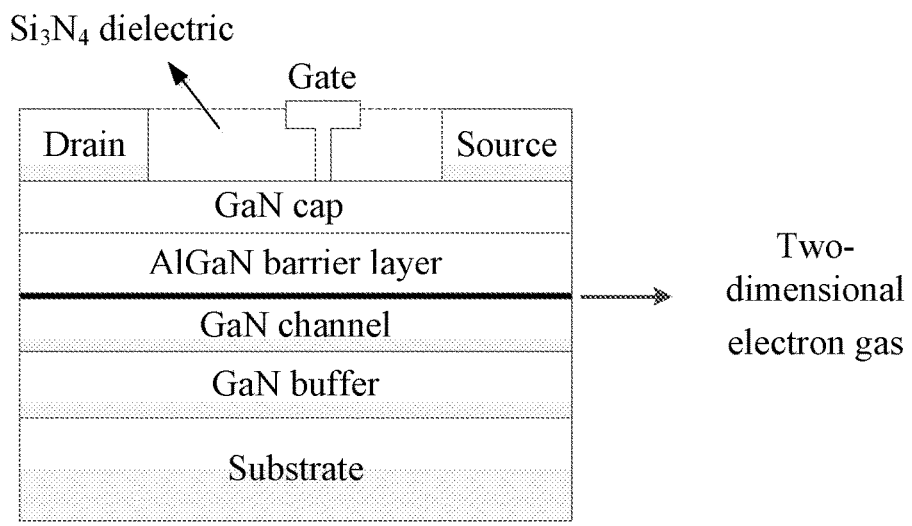
FIG. 1 is a structural principle diagram of a GaN HEMT radio frequency power device in the prior art.

In the figures, Drain is a drain port, Gate is a gate port, Source is a source port, $Si_3N_4$ is a dielectric material between every two of a gate, a drain, and a source, GaN cap is a device protection layer, AlGaN barrier layer and AlGaN extra layer are barrier layers that confines free electrons in a corresponding two-dimensional electron gas to move and are respectively marked as a first barrier layer and a second barrier layer, GaN channel is a channel layer having a high concentration of the free electrons, GaN buffer is a buffer layer, Substrate is a substrate of the device, an original first two-dimensional electron gas is located between AlGaN barrier layer and GaN channel, and a newly formed second two-dimensional electron gas is located between GaN channel and AlGaN extra layer.

DETAILED DESCRIPTION OF THE EMBODIMENTS

The technical solution provided by the present disclosure will be further described below with reference to the accompanying drawings.

A semiconductor device mainly relates to technical fields such as a semiconductor epitaxial material, semiconductor device processing, and semiconductor circuit design. At present, researchers usually improve the semiconductor device in terms of a semiconductor material, a device structure, and a processing technique; while, the semiconductor circuit design is relatively independent and belongs to the technical field of semiconductor device applications, and has no overlap in technology with the above field.

The existing GaN HEMT radio frequency power device has a relatively large defect in linearity performance. To fundamentally analyze the causes of linearity defect in the GaN HEMT device, the present disclosure first performs deduction at the circuit level, then maps to the device process, and finally to the epitaxial material layer.

The applicant found in the research that the linearity performance of the GaN HEMT radio frequency power device may also be expressed as the variation Δ of a gain with output power. The closer Δ is to 0, the better the linearity performance is, and the farther Δ is from 0, the worse the linearity performance is. Δ may be expressed as the following formula:

$$\Delta = K \times \frac{d\left(\frac{gm^2}{gm + s \times Cgs}\right)}{d(Pout)} \quad (1)$$

$$gm = \sqrt{\frac{N(x)}{|VGS| + |VDS|}} \quad (2)$$

In the formulas, K is a constant, gm is a transconductance of the power device, Cgs is a parasitic capacitance from Gate to Source, s is a frequency response (which is a fixed value once an operating frequency is determined), Pout is output power of the power device, N(ˣ) is a concentration of electrons in a two-dimensional electron gas, and VGS and VDS are a voltage on a gate-source and a voltage on a drain-source, respectively.

In the process of increasing the output power from a small signal to saturated power, a voltage swing on the gate-source and a voltage swing on the drain-source continue to increase, which means that |VGS|+|VDS| continues to increase. In addition, the increase of |VGS| causes the electrons in the two-dimensional electron gas to be continuously suctioned into the gate, leading N(ˣ) to become small. Finally, gm decreases with the increase of the output power, resulting in Δ getting farther and farther away from 0 with the increase of the output power, and greatly deteriorating the linearity performance. This is also one of the main reasons why the GaN HEMT radio frequency power device has a relative large defect in linearity performance.

Figure 2:
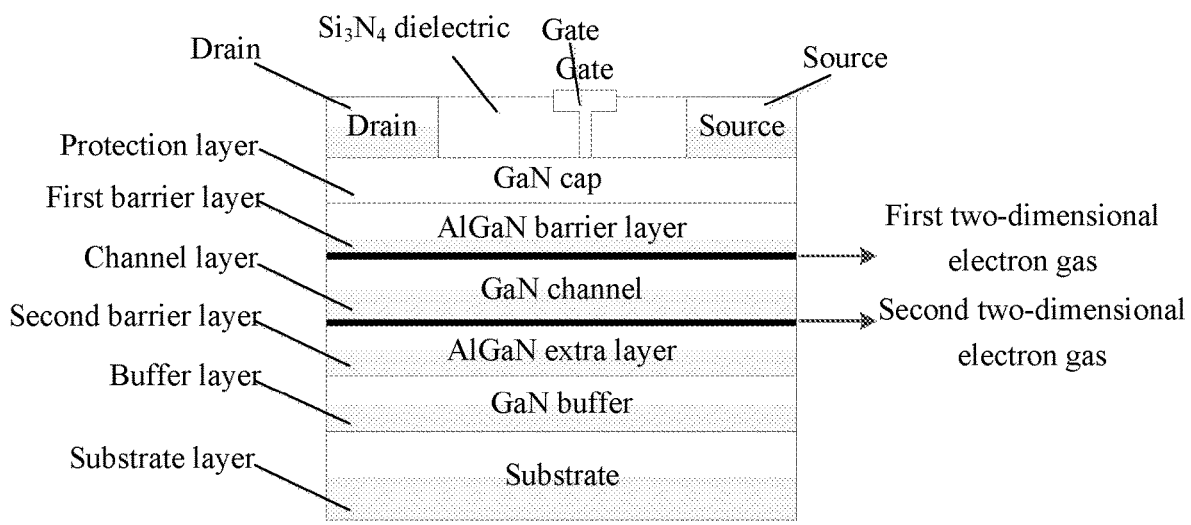
FIG. 2 is a structural cross-sectional diagram of a high-linearity GaN HEMT radio frequency power device for improving a transconductance under a large signal according to the present disclosure.

Based on the above theoretical analysis, the present disclosure provides a high-linearity GaN HEMT radio frequency power device for improving a transconductance under a large signal. FIG. 2 shows a structural block diagram of the device. The GaN HEMT radio frequency power device includes a substrate layer, a buffer layer, a second barrier layer (AlGaN extra layer), a channel layer (GaN channel layer), a first barrier layer (AlGaN barrier layer), and a protection layer arranged in sequence. A source, a gate, and a drain are arranged on the protection layer. A first two-dimensional electron gas and a second two-dimensional electron gas are respectively formed between the channel layer and the first barrier layer and between the channel layer and the second barrier layer. The source, the gate, and the drain are configured to receive an external control signal to control the motion of electrons in the first two-dimensional electron gas and the second two-dimensional electron gas formed by the channel layer.

In the above technical solution, Gate is energized to generate an electric field in a direction perpendicular to the two-dimensional electron gas. As the electric field on Gate is gradually strengthened, the electrons in the first two-dimensional electron gas escape from the two-dimensional electron gas to reach Gate, resulting in the loss of the electrons. When the electric field is strengthened to a certain extent, the electrons in the original two-dimensional electron gas are not lost. After AlGaN extra layer is introduced, the electrons in the newly formed second two-dimensional electron gas are also affected by the electric field to move towards Gate. In this process, some electrons move into the original first two-dimensional electron gas, thereby making up for the loss of the electrons in the original two-dimensional electron gas. That is, in the case of the large signal, the electrons in the second two-dimensional electron gas flow into the first two-dimensional electron gas.

Compared with the conventional structure, according to the present disclosure, one AlGaN extra layer is added below GaN channel layer to finally form channel layer, AlGaN extra layer, and AlGaN barrier layer. The thickness of AlGaN extra layer and the thickness of AlGaN barrier layer remain the same. GaN channel layer cannot be too thick, or otherwise, the second two-dimensional electron gas cannot enter the first two-dimensional electron gas. Usually, GaN channel layer has a thickness of about 100 nanometers. At this time, the electrons in one layer of second two-dimensional electron gas formed by GaN channel layer and AlGaN extra layer can effectively make up for the loss of the electrons in the original two-dimensional electron gas, thereby relieving the decrease of gm, further relieving the tendency of a Δ value to be far from 0, and effectively improving the linearity of the device.

By adoption of the above technical solution, a layer of AlGaN is introduced onto the GaN channel layer, such that a new layer of two-dimensional electron gas is formed below the original two-dimensional electron gas inside the device. When Pout is a small signal, the electron concentration in the original two-dimensional electron gas basically does not change. When Pout gradually increases, the electrons in the original two-dimensional electron gas are suctioned into the gate, the electrons in the newly formed two-dimensional electron gas flow into the original two-dimensional electron gas at this time, and the electron concentration in the original two-dimensional electron gas is greatly increased, thereby relieving the decrease of gm, further relieving the tendency of a Δ value to be far from 0, and effectively improving the linearity of the device.

The above description of embodiments is merely provided to help illustrate the method of the present disclosure and a core idea thereof. It should be noted that several improvements and modifications may be made by persons of ordinary skills in the art without departing from the principle of the present disclosure, and these improvements and modifications should also fall within the protection scope of the present disclosure.

The above description of the disclosed embodiments enables those skilled in the art to achieve or use the present disclosure. Various modifications to these embodiments are readily apparent to those skilled in the art, and the generic principles defined herein may be practiced in other embodiments without departing from the spirit or scope of the present disclosure. Thus, the present disclosure is not limited to the embodiments shown herein but falls within the widest scope consistent with the principles and novel features disclosed herein.

What is claimed is:

1. A gallium nitride (GaN) high electron mobility transistor (HEMT) radio frequency power device, comprising a substrate layer, a buffer layer, a second barrier layer, a channel layer, a first barrier layer, and a protection layer arranged in sequence, wherein a source, a gate, and a drain are arranged on the protection layer; a first two-dimensional electron gas and a second two-dimensional electron gas are respectively formed between the channel layer and the first barrier layer and between the channel layer and the second barrier layer; the source, the gate, and the drain are configured to receive an external control signal to control motion of electrons in the first two-dimensional electron gas and the second two-dimensional electron gas formed by the channel layer; and in case of an output power of the GaN HEMT radio frequency power device being equal or greater than a predetermined power, electrons in the second two-dimensional electron gas flow into the first two-dimensional electron gas for making up for loss of electrons in the first two-dimensional electron gas.

2. The GaN HEMT radio frequency power device according to claim 1, wherein the channel layer has a thickness of 100 nanometers.

3. The GaN HEMT radio frequency power device according to claim 2, wherein the channel layer is made of a GaN material.

4. The GaN HEMT radio frequency power device according to claim 2, wherein the first barrier layer and the second barrier layer are made of an AlGaN material.

5. The GaN HEMT radio frequency power device according to claim 2, wherein the substrate layer is made of a SiC material.

6. The GaN HEMT radio frequency power device according to claim 2, wherein the buffer layer is made of a GaN material.

7. The GaN HEMT radio frequency power device according to claim 2, wherein an $Si_3N_4$ dielectric material is filled between two of the source, the gate, and the drain.

8. The GaN HEMT radio frequency power device according to claim 1, wherein the channel layer is made of a GaN material.

9. The GaN HEMT radio frequency power device according to claim 1, wherein the first barrier layer and the second barrier layer are made of an AlGaN material.

10. The GaN HEMT radio frequency power device according to claim 1, wherein the substrate layer is made of a SiC material.

11. The GaN HEMT radio frequency power device according to claim 1, wherein the buffer layer is made of a GaN material.

12. The GaN HEMT radio frequency power device according to claim 1, wherein an $Si_3N_4$ dielectric material is filled between two of the source, the gate, and the drain.

* * * * *